(12) United States Patent
Hara et al.

(10) Patent No.: US 10,186,489 B2
(45) Date of Patent: Jan. 22, 2019

(54) PROCESS SUBSTRATE WITH CRYSTAL ORIENTATION MARK, METHOD OF DETECTING CRYSTAL ORIENTATION, AND READING DEVICE OF CRYSTAL ORIENTATION MARK

(71) Applicant: NATIONAL INSTITUTE OF ADVANCED INDUSTRIAL SCIENCE AND TECHNOLOGY, Tokyo (JP)

(72) Inventors: Shiro Hara, Tsukuba (JP); Sommawan Khumpuang, Tsukuba (JP); Shinichi Ikeda, Tsukuba (JP)

(73) Assignee: NATIONAL INSTITUTE OF ADVANCED INDUSTRIAL SCIENCE AND TECHNOLOGY, Tokyo (JP)

( * ) Notice: Subject to any disclaimer, the term of this patent is extended or adjusted under 35 U.S.C. 154(b) by 353 days.

(21) Appl. No.: 14/913,176

(22) PCT Filed: Jul. 24, 2014

(86) PCT No.: PCT/JP2014/069570
§ 371 (c)(1),
(2) Date: Feb. 19, 2016

(87) PCT Pub. No.: WO2015/025674
PCT Pub. Date: Feb. 26, 2015

(65) Prior Publication Data
US 2016/0211218 A1 Jul. 21, 2016

(30) Foreign Application Priority Data
Aug. 20, 2013 (JP) .................................. 2013-170122

(51) Int. Cl.
*H01L 23/544* (2006.01)
*G01B 11/14* (2006.01)
(Continued)

(52) U.S. Cl.
CPC ............ *H01L 23/544* (2013.01); *G01B 11/14* (2013.01); *H01L 21/67259* (2013.01);
(Continued)

(58) Field of Classification Search
CPC ............ H01L 23/544; H01L 21/67282; H01L 21/67242; H01L 21/67294
See application file for complete search history.

(56) References Cited

U.S. PATENT DOCUMENTS 5,716,876 A    2/1998  Muramatsu
5,786,701 A *  7/1998  Pedder ............... G01R 1/07314
                                                324/756.05

(Continued)

FOREIGN PATENT DOCUMENTS

JP    6-213652    8/1994
JP    7-201688    8/1995
(Continued)

OTHER PUBLICATIONS

International Search Report dated Oct. 28, 2014, in corresponding International Application No. PCT/JP2014/069570.

*Primary Examiner* — Tri Ton
*Assistant Examiner* — Rebecca C Bryant
(74) *Attorney, Agent, or Firm* — Staas & Halsey LLP

(57) ABSTRACT

To provide a crystal orientation mark which can be formed easily and inexpensively, and which enables to perform high precision alignment and allows information other than crystal orientation to be included, even for a small diameter process substrate. A crystal orientation mark is drawn on the surface of the process substrate. The crystal orientation mark (Continued)

includes a marking region for crystal orientation detection, and a marking region for information. The marking region for crystal orientation detection is provided at two locations in an outer edge portion of the process substrate to be used for the alignment of the process substrate. The marking region for information is provided on a straight-line region connecting the marking regions for crystal orientation detection at the two locations, and includes a pattern for demonstrating predetermined information relating to the process substrate.

10 Claims, 5 Drawing Sheets

(51) Int. Cl.
  *H01L 29/04* (2006.01)
  *H01L 21/67* (2006.01)
(52) U.S. Cl.
  CPC ...... *H01L 21/67282* (2013.01); *H01L 29/045* (2013.01); *H01L 21/67294* (2013.01); *H01L 2223/5442* (2013.01); *H01L 2223/54426* (2013.01); *H01L 2223/54453* (2013.01); *H01L 2223/54493* (2013.01); *H01L 2924/0002* (2013.01)

(56) References Cited

U.S. PATENT DOCUMENTS

| | | | | |
|---|---|---|---|---|
| 7,007,855 | B1 * | 3/2006 | Barker | H01L 23/544 |
| | | | | 235/494 |
| 9,779,931 | B2 * | 10/2017 | Freund | H01L 21/263 |
| 2007/0228400 | A1 * | 10/2007 | Fujita | C30B 29/406 |
| | | | | 257/94 |

FOREIGN PATENT DOCUMENTS

| | | |
|---|---|---|
| JP | 9-129578 | 5/1997 |
| JP | 2007-297263 | 11/2007 |
| JP | 2011-3773 | 1/2011 |

\* cited by examiner

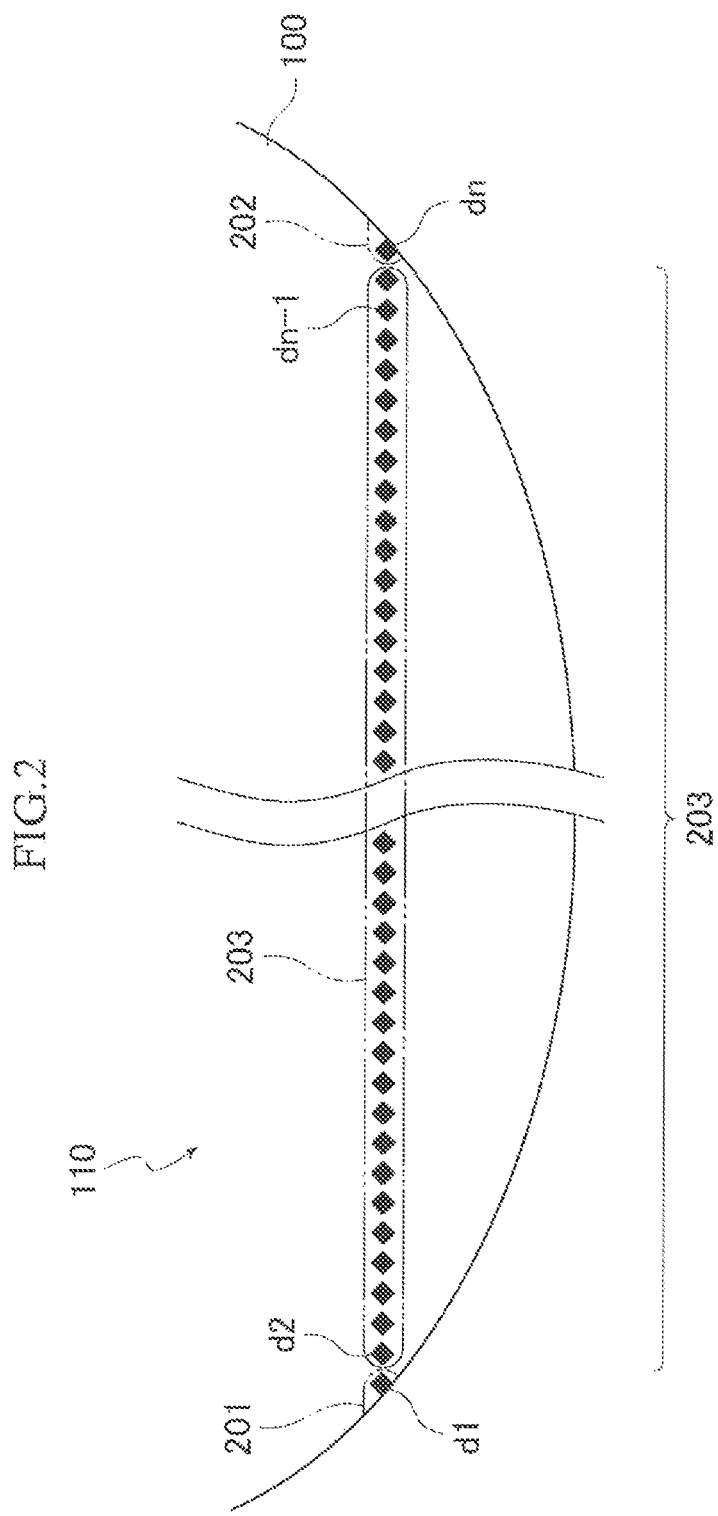

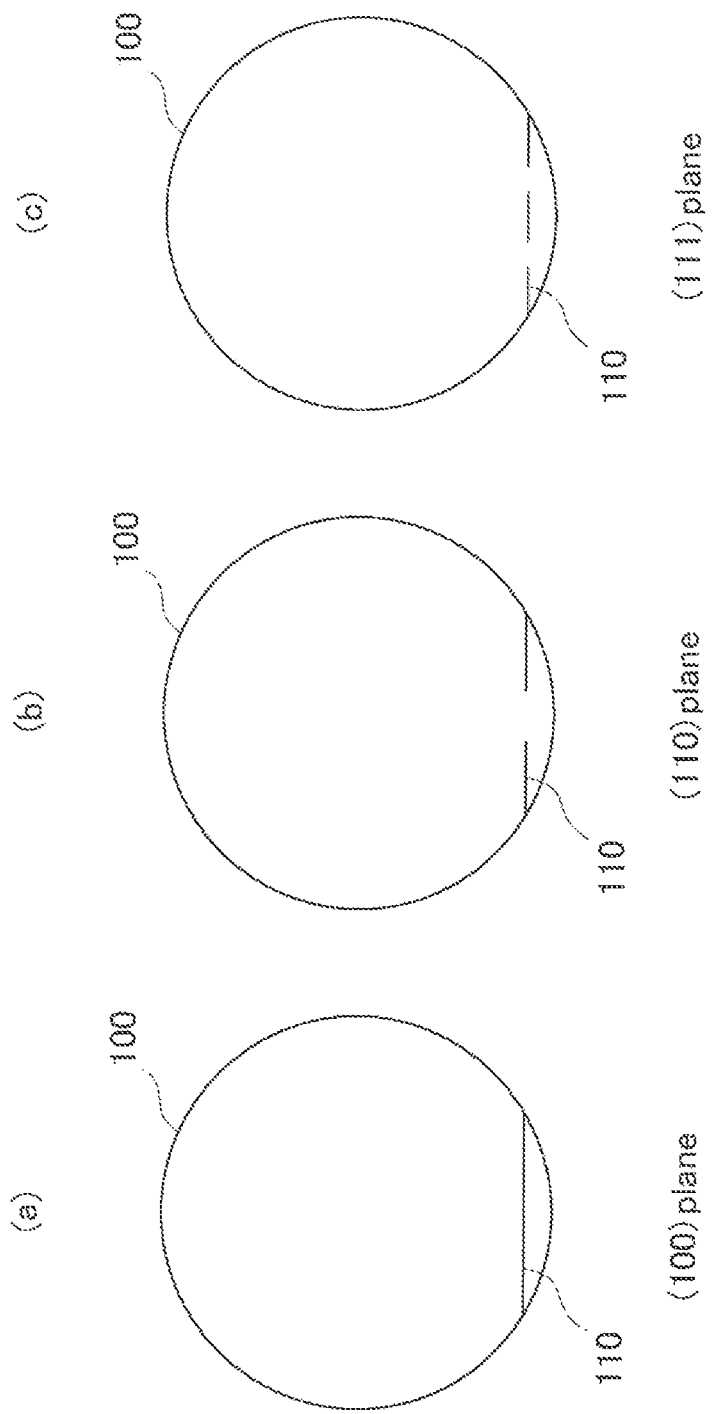

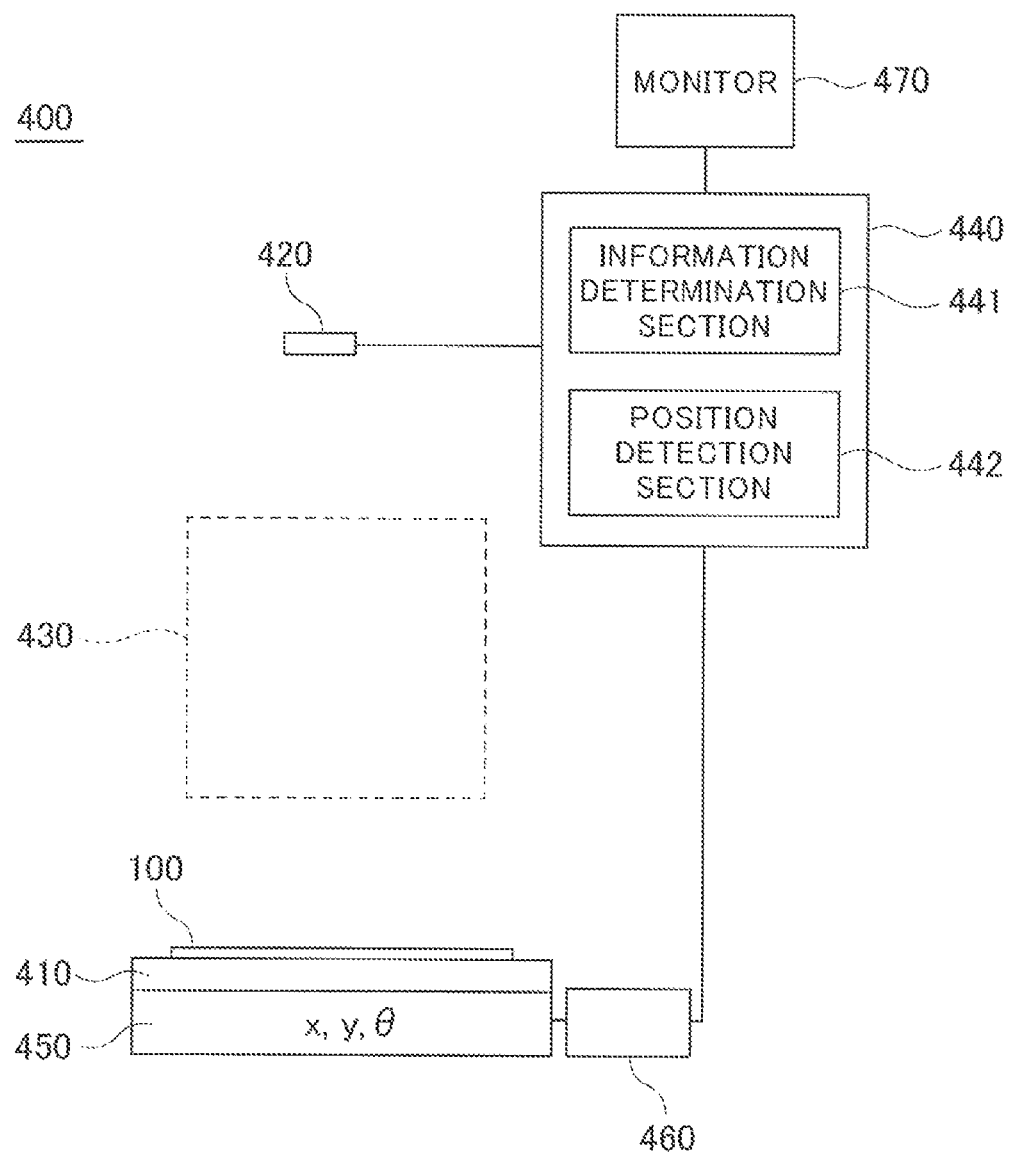

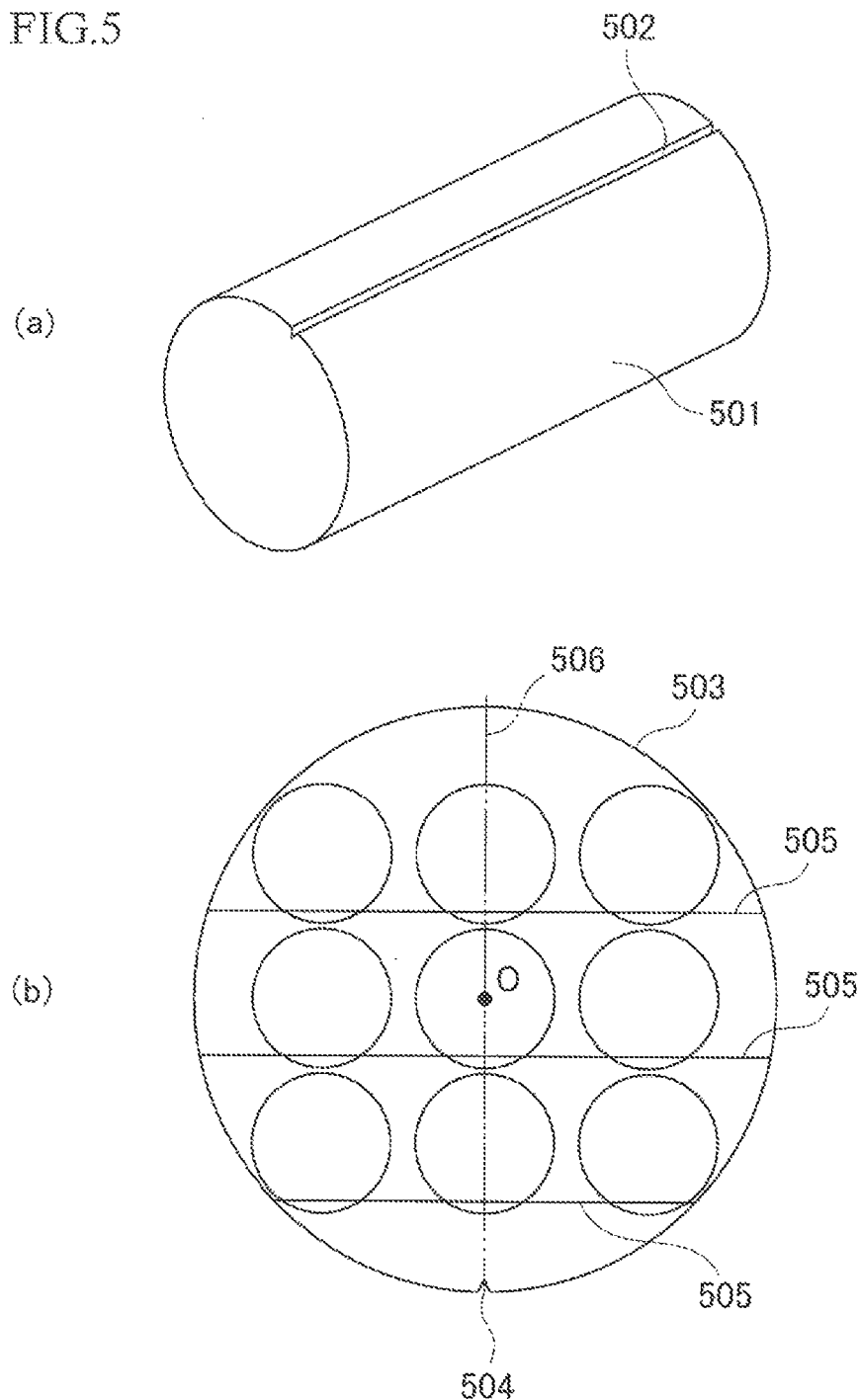

PROCESS SUBSTRATE WITH CRYSTAL ORIENTATION MARK, METHOD OF DETECTING CRYSTAL ORIENTATION, AND READING DEVICE OF CRYSTAL ORIENTATION MARK

CROSS-REFERENCE TO RELATED APPLICATIONS

This application is a U.S. National Stage Application, which claims the benefit under 35 U.S.C. § 371 of PCT International Patent Application No. PCT/JP2014/069570, filed Jul. 24, 2014, which claims the foreign priority benefit under 35 U.S.C. § 119 of Japanese Patent Application No. 2013-170122, filed Aug. 20, 2013, the contents of which are incorporated herein by reference.

TECHNICAL FIELD

The present invention relates to a process substrate, i.e. a substrate to be processed, added with a crystal orientation mark, and a method and apparatus for detecting crystal orientation by using such process substrate. The present invention is suitable for application to a small-diameter semiconductor wafer having, for example, a diameter of not more than 20 mm.

BACKGROUND ART

Conventional process substrates with crystal orientation mark will be described by taking a semiconductor wafer as an example.

Conventionally, a semiconductor wafer is formed with an orientation flat or a notch for the purposes of its alignment during manufacturing processes and explicit indication of the in-plane crystal axis (orientation) of the wafer, (see, for example, paragraphs [0005] to [0006] of Japanese Patent Laid-Open No. 2011-3773). Here, orientation flat means a straight-line shaped outer edge portion formed in a semiconductor wafer. On the other hand, a notch means a cut formed in the vicinity of an outer edge portion of a semiconductor wafer.

Moreover, conventionally, it is also known that orientation flat is formed at two locations, thereby allowing the kind of wafer and the like to be distinguished (for example, see paragraph [0021] etc. of Japanese Patent Laid-Open No. H06-213652). In such a semiconductor wafer, it is possible to identify crystal plane orientations (generally, of three kinds: (100), (110), and (111) in the case of a silicon wafer) and the distinction between P-type/n-type of a wafer.

Further, as a method for discriminating the kind of semiconductor wafer and the like, there is also known a method of drawing with laser on a side face of the semiconductor wafer (see, for example, paragraph [0028] etc. of Japanese Patent Laid-Open No. H07-201688).

In a conventional semiconductor manufacturing technique, attempts have been made to reduce unit cost for manufacturing a chip by increasing the diameter of the semiconductor wafer. However, although such a large scale manufacturing system will contribute to reduction of unit cost for manufacturing a chip in a production of small-kinds in large quantities, it hardly responds to the demand of a production of many-kinds in small quantities, and makes it difficult to adjust the production quantities in response to market conditions, also making the market penetration by small businesses difficult. To solve these problems, it is desired to construct a manufacturing line using a small-scale semiconductor manufacturing apparatus which enables manufacturing of semiconductor chips at low cost using a small-diameter wafer (for example, a diameter of 0.5 inches) (see: Japanese Patent Laid-open No. 2012-54414). As one technical problem in promoting practical application and wide spreading of such a small-scale semiconductor manufacturing apparatus, the present inventors have studied on alignment technique of a small-diameter wafer and the like.

As a result of that, it has been revealed that in the case of a small-diameter wafer, it is necessary to form an orientation flat or a notch in a very small size, and therefore, it is difficult to realize a sufficiently accurate alignment inexpensively.

Moreover, it is also revealed that forming a small notch in a small-diameter wafer will take a lot of time and effort for surface finishing, and is against the demand for cost reduction in this respect as well.

Furthermore, a method of performing laser drawing to discriminate the kind of wafer and the like is also against the purpose of developing a small-diameter wafer as described above, since it is necessary to perform a laser drawing process in addition to the process of forming an orientation flat or a notch, thus causing increases in the cost and the number of processes.

Therefore, to perform alignment of wafer and identification of the kind thereof inexpensively with high precision for a small-diameter wafer, it is desirable to use a method different from the conventional orientation flat and notch.

It is an object of the present invention to provide at a low price a process substrate added with a crystal orientation mark which enables high precision alignment and allows information other than crystal orientation to be included, and also provide a method and an apparatus for detecting a crystal orientation by using such process substrate.

Solution to Problem

A process substrate with crystal orientation mark according to the present invention is provided with a marking which includes: a marking region for crystal orientation detection which is provided at two locations on an outer edge portion of the process substrate to determine an in-plane crystal axis of the process substrate; and a marking region for information which is provided on a straight-line region connecting the marking regions for crystal orientation detection at the two locations, and in which a pattern to demonstrate predetermined information relating to the process substrate is formed.

In the process substrate with crystal orientation mark of the present invention, it is preferable that the marking is at least one straight line or broken line.

In the process substrate with crystal orientation mark of the present invention, it is preferable that at least part of the marking is formed by arranging a plurality of dots in a straight line shape or a broken line shape.

In the process substrate with crystal orientation mark of the present invention, it is preferable that the predetermined information is information to determine a crystal plane orientation of the process substrate.

In the process substrate with crystal orientation mark of the present invention, it is preferable that the process substrate is a wafer having a diameter of not more than 20 mm.

A method of detecting crystal orientation of a process substrate according to the present invention is a method of detecting crystal orientation of a process substrate to determine an in-plane crystal axis of the process substrate by using the above described process substrate with crystal orientation mark of the present invention, the method including determining the in-plane crystal axis of the process substrate from positions of the marking regions for crystal orientation detection at the two locations, and determining the predetermined information relating to the process substrate from a pattern of the marking region for information.

A reading device of crystal orientation mark of a process substrate according to the present invention is a reading device of crystal orientation mark of a process substrate to determine an in-plane crystal axis of the process substrate with crystal orientation mark of the above described present invention, the reading device including: a reading section to read the marking including the marking region for crystal orientation detection and the marking region for information from the process substrate; a position detection section to determine the in-plane crystal axis of the process substrate from positions of the marking regions for crystal orientation detection at the two locations; and an information determination section to demonstrate the predetermined information relating to the process substrate from a pattern formed in the marking region for information.

Advantageous Effects of Invention

A process substrate with crystal orientation mark of the present invention is configured such that a marking region for crystal orientation detection is formed at two locations in an outer edge portion of the process substrate, and an in-plane crystal axis of the process substrate is determined by using the marking regions for crystal orientation detection of those two locations. Therefore, according to the present invention, it is possible to add a crystal orientation mark, which enables high precision alignment, on a process substrate inexpensively by a simple process.

Moreover, the process substrate with crystal orientation mark of the present invention is configured such that a pattern for demonstrating predetermined information relating to the process substrate is formed in a straight line region connecting the marking regions for crystal orientation detection at the two locations, that is, a marking region for information. Therefore, according to the present invention, it is possible to add predetermined information relating to the process substrate on the process substrate inexpensively by a simple process.

Since in the process substrate with crystal orientation mark of the present invention, a marking region for crystal orientation detection and a marking region for information can be formed in a same process by configuring the marking to be at least one straight line or broken line, the process of forming the crystal orientation mark becomes simpler and more inexpensive.

According to a process substrate with crystal orientation mark of the present invention, a crystal orientation mark can be easily formed by laser marking by making up at least part of the marking with an array of plurality of dots.

According to a process substrate with crystal orientation mark of the present invention, it is possible to display a crystal plane orientation on a process substrate in an inexpensive and simple manner by configuring the pattern of the marking region for information to be a pattern that indicates information to determine the crystal plane orientation of the process substrate.

According to a process substrate with crystal orientation mark of the present invention, it is possible to form a crystal orientation mark which enables high precision alignment inexpensively by a simple process even when a wafer having a diameter of not more than 20 mm is adopted as the process substrate.

According to a method of detecting crystal orientation of a process substrate according to the present invention, since the in-plane crystal axis of the process substrate is determined by reading the marking regions for crystal orientation detection at two locations, and the predetermined information is determined from the pattern of the marking region for information, it is very easy to determine the in-plane crystal axis and the predetermined information.

According to a reading device of crystal orientation mark according to the present invention, since the in-plane crystal axis of the process substrate is determined by reading the marking regions for crystal orientation detection at two locations, and the predetermined information is determined from the pattern of the marking region for information, it is very simple to determine the in-plane crystal axis and the predetermined information, and therefore the device becomes inexpensive.

BRIEF DESCRIPTION OF DRAWINGS

FIG. 2 is a partially enlarged view of the process substrate shown in FIG. 1.

FIG. 3 is a conceptual diagram, in which (a) to (c) each illustrates a marking region for information of the crystal orientation mark shown in FIG. 1.

FIG. 4 is a conceptual diagram to show the configuration of a reading device of crystal orientation mark according to Embodiment 1.

FIG. 5 is a conceptual diagram to illustrate the manufacturing process of a process substrate according to Embodiment 1, in which (a) is a perspective view, and (b) is a plan view.

DESCRIPTION OF EMBODIMENTS

Embodiment 1 of the Present Invention

Figure 1:
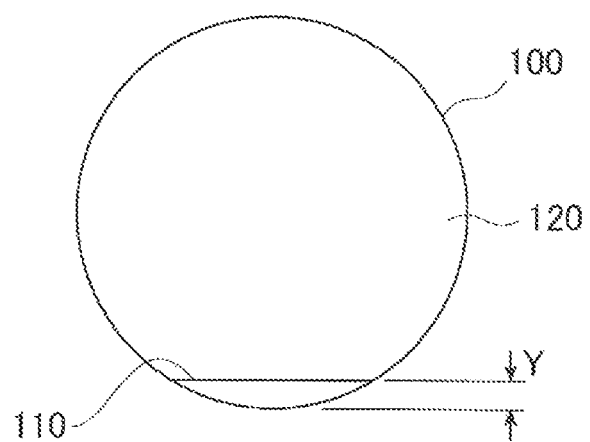
FIG. 1 is a conceptual plan view to show the configuration of a process substrate according to Embodiment 1.

Hereafter, Embodiment 1 of the present invention will be describe by using FIGS. 1 to 5 by taking as an example a case in which the present invention is applied to a semiconductor wafer.

FIG. 1 is a plan view to conceptually show a wafer with a crystal orientation mark (hereafter, simply referred to as "wafer") 100 according to Embodiment 1. As shown in FIG. 1, the wafer 100 according to Embodiment 1 is formed with a crystal orientation mark 110.

The dimension of the wafer 100 is not particularly limited. However, this embodiment is particularly beneficial when it is applied to a small-diameter wafer having a diameter of not more than 20 mm (for example, a diameter of 0.5 inches).

The crystal orientation mark 110 is formed along a predetermined in-plane crystal orientation of the wafer 100. When the diameter of the wafer 100 is 0.5 inches, it is preferable that a distance Y between an outer edge of the wafer 100 and the crystal orientation mark 110 is 0.5 to 3 mm. This is because, when the distance Y is too small, spacing between marking regions for crystal orientation detection 201 and 202 (to be described below) which are formed at both ends of the crystal orientation mark 110 becomes small, making it difficult to perform alignment with sufficient precision; and when the distance Y is too large, an integrated circuit forming region 120 (a portion of the surface of the wafer 100 higher than the crystal orientation mark 110 in FIG. 1) becomes narrow.

The line width of the crystal orientation mark 110 is arbitrary, and although a line width which can be mechanically read by at least an optical sensor, etc. is preferable, a line width which can be visually recognized is further preferable.

The method for forming the crystal orientation mark 110 is not particularly limited. For example, it can be formed by using drawing with laser light, scribing with a scriber, grooving with a dicer, and the like.

FIG. 2 is a partially enlarged view of the wafer 100, showing an example in which the crystal orientation mark 110 is formed by using laser light. As shown in FIG. 2, in Embodiment 1, the crystal orientation mark 110 is formed by forming a plurality of dot-like depressions d1, d2, ..., dn on a straight line region by using laser light.

The crystal orientation mark 110 includes two marking regions for crystal orientation detection 201 and 202, and a marking region for information 203.

As shown in FIG. 2, the marking regions for crystal orientation detection 201 and 202 are provided in the vicinity of an outer edge of the wafer 100. In these marking regions for crystal orientation detection 201 and 202, a mark for determining the direction of the in-plane crystal axis of the wafer 100 (that is, for performing alignment of the wafer 100) is formed. In the example of FIG. 2, a dot-like depression d1 is formed in the marking region for crystal orientation detection 201, and a dot-like depression dn is formed in the marking region for crystal orientation detection 202.

As described above, the crystal orientation mark 110 is formed along a predetermined in-plane crystal orientation of the wafer 100. Therefore, a straight line connecting those two dot-like depressions d1 and dn is supposed to follow the in-plane crystal orientation. For this reason, detecting the positions of the two dot-like depressions d1 and d2 makes it possible to align the position (position in the rotational direction) of the wafer 100 with a desired in-plane crystal orientation in each process during semiconductor manufacturing. The position detection of dot-like depressions d1 and d2 can be performed by using, for example, an area sensor (to be described below).

The marking region for information 203 is provided on a straight line region connecting the marking regions for crystal orientation detection 201 and 202, and is formed with a pattern for demonstrating information relating to the wafer 100. In Embodiment 1, the marking region for information 203 is formed with dot-like depressions d2 to dn−1.

It is noted that although the crystal orientation mark 110 is formed by disposing a plurality of dot-like depressions d1 to dn on a straight line region, the crystal orientation mark may be formed by drawing a straight line or a broken line by using, for example, laser light.

When the crystal orientation mark 110 is formed by a straight line pattern, such as one straight line and broken line, both end portions provide marking regions for crystal orientation detection 201 and 202, and other portions provide a marking region for information 203.

FIGS. 3(a) to 3(c) conceptually show an example of pattern formed in the marking region for information 203.

In the example of FIG. 3, the pattern of the marking region for information 203 is determined according to the crystal plane orientation of the wafer 100. In this example, as shown in (a), when the crystal plane orientation is (100), a pattern consisting of one straight line is formed in the marking region for information 203, and as shown in (b), when the crystal plane orientation is (110), a pattern consisting of a straight line divided into two pieces is formed in the marking region for information 203, and further as shown in (c), when the crystal plane orientation is (111), a pattern consisting of a straight line divided into three pieces is formed in the marking region for information 203.

It is noted that although each line segment of the pattern is shown by a straight line in FIG. 3, each line segment may be formed of a plurality of dot-like depressions as shown in FIG. 2.

Moreover, in the example of FIG. 3, although three kinds of patterns are defined according to the crystal plane orientation of the wafer 100, the kind of information represented by the pattern of the marking region for information 203 is arbitrary. For example, two kinds of patterns may be defined according to the conduction type (n-type and p-type) of the wafer 100, or six kinds of patterns may be defined according to combination of the crystal plane orientation and the conduction type. Further, predetermined kinds of the patterns of the marking region for information 203 may be defined according to information other than the crystal plane orientation and the conduction type.

In addition, in the example of FIG. 3, although an example in which only one pattern is formed in the marking region for information 203 is shown, not less than two patterns may be formed.

Next, a method of detecting crystal orientation and a reading device of crystal orientation mark according to Embodiment 1 will be described.

FIG. 4 conceptually shows the configuration of a reading device of crystal orientation mark 400 according to Embodiment 1. The reading device of crystal orientation mark 400 is mounted on, for example, a semiconductor manufacturing apparatus such as an lithography apparatus and performs alignment of the wafer 100, and the like.

In FIG. 4, a wafer stage 410 is a base for placing the wafer 100 thereon.

An area sensor 420 picks up an image of the surface of the wafer 100 placed on the wafer stage 410 and outputs it as image information.

An optical system 430 forms an image of light, which is radiated from light projection means (not shown) and is reflected at the wafer 100, on a light reception surface of the area sensor 420.

A computing section 440 extracts image information of the crystal orientation mark 110 from the image information of the wafer 100 picked up by the area sensor 420, and performs alignment of the wafer 100, discrimination of the kind of wafer and the like by using such extracted image information. For that purpose, the computing section 440 includes an information reading section 441 and a position detection section 442.

The information reading section 441 extracts image information of the crystal orientation mark 110 from the image information picked up by the area sensor 420. Then, the information reading section 441 analyzes the crystal orientation mark 110 to discriminate the kind of the pattern (see FIG. 3) formed on the marking region for information 203. The result of discrimination can be displayed on, for example, a monitor 470.

The position detection section 442 respectively stores the positions of the marking regions for crystal orientation detection 201 and 202 when the wafer 100 is correctly aligned. In the case of the example of FIG. 2, position coordinates of the dot-like depressions d1 and dn when the wafer 100 is correctly aligned are stored with respect to coordinate axes x, y, and θ, respectively. Then, the position detection section 442 determines the positions of the marking regions for crystal orientation detection 201 and 202 from the image information picked up by the area sensor 420 and compares them with the position coordinates when correct alignment is performed. Further, the position detection section 442 calculates, based on this comparison result, amounts of movement to move the marking regions for crystal orientation detection 201 and 202 to correct positions with respect to x, y, and θ axis directions, respectively. Then, the position detection section 442 generates a driving control signal based on the calculation result, and sends it to a driving control section 460.

A driving mechanism 450 performs alignment of the wafer 100 by moving the wafer stage 410 in the x, y, and θ axis directions.

The driving control section 460 controls the driving of the driving mechanism 450 based on the driving control signal inputted from the computing section 440. As a result of this, the wafer stage 410 is moved, thereby causing the wafer 100 to be correctly aligned.

When the wafer 100 is conveyed into a semiconductor manufacturing apparatus (not shown) and is placed on the wafer stage 410, first, the alignment of the wafer 100 is performed by using the reading device of crystal orientation mark 400 of FIG. 4. Thereafter, the semiconductor manufacturing apparatus performs surface treatment of the wafer 100 and the like.

FIG. 5 is a conceptual diagram to illustrate one example of the manufacturing method of the wafer 100. FIG. 5 is an example of fabricating a wafer 100 according to Embodiment 1 by using a large-diameter semiconductor wafer.

In this example, first, an ingot 501 for a large-diameter wafer is prepared (see FIG. 5(*a*)), and the crystal orientation of this ingot is measured by using, for example, X-ray diffraction or the like.

Next, a groove 502 is formed in the side face of the ingot 501 so as to correspond to a predetermined crystal orientation. As shown in FIG. 5(*a*), the groove 502 is formed along the longitudinal direction of the ingot.

Further, by using, for example, an inner blade or a wire saw, the ingot 501 is sliced. This makes it possible to fabricate a plurality of large-diameter wafers 503 having a predetermined thickness (see FIG. 5(*b*)). Moreover, a notch 504 is formed by the above described groove 502.

Next, a linear mark 505, which is to serve as a crystal orientation mark 110, at a predetermined position of the large-diameter wafer 503. As described above, this mark 505 can be formed by drawing with laser light, scribing with a scriber, grooving with a dicer, and the like. The position to form the mark 505 may be determined, for example, so as to be perpendicular to an imaginary line 506 which passes through center O and the notch 504 of the large-diameter wafer 503.

Then, a plurality of small-diameter wafers 100 are cut out by using, for example, laser beam machining or the like. The position at which the wafer 100 is cut is determined such that a part of the mark 505 is disposed at a predetermined position of the small-diameter wafer 100. A portion of the mark 505, which is formed on the wafer 100, provides a crystal orientation mark 110 of Embodiment 1.

Thereafter, processing such as beveling etc. is performed and the manufacturing process of the wafer 100 is completed.

According to the manufacturing method shown in FIG. 5, it is possible to fabricate crystal orientation marks of a plurality of small-diameter wafers 100 at the same time by using one notch 504 formed in the large-diameter wafer 503.

Forming a notch 504 in the large-diameter wafer 503 is easier than forming a notch in s small-diameter wafer 100. Therefore, according to the manufacturing method shown in FIG. 5, it is possible to manufacture a small-diameter wafer 100 according to Embodiment 1 easily and inexpensively.

However, the wafer 100 according to Embodiment 1 can also be fabricated from a small-diameter ingot (not shown). That is, first, a wafer 100 is formed by slicing a small-diameter ingot, and then the crystal orientation of each wafer 100 is individually measured, and next, based on this measurement result, a crystal orientation mark 110 may be formed for each wafer 100.

As described so far, Embodiment 1 is configured such that marking regions for crystal orientation detection 201 and 202 are formed at two locations in an outer edge portion of the wafer 100, and the in-plane crystal axis of the wafer 100 is determined by using the marking regions for crystal orientation detection 201 and 202 at the two locations. Therefore, according to Embodiment 1, it is possible to add a crystal orientation mark 110 which enables high precision alignment to the wafer 100 inexpensively by a simple process.

Moreover, Embodiment 1 is configured such that a pattern for demonstrating predetermined information relating to wafer 100 is formed in a straight line region (that is, the marking region for information 203) connecting the marking regions for crystal orientation detection 201 and 202 at the two locations. Therefore, according to Embodiment 1, it is possible to add predetermined information relating to the wafer 100 to the wafer 100 inexpensively by a simple process.

Since Embodiment 1 is configured such that the crystal orientation mark 110 is at least one straight line or broken line, it is possible to form the marking regions for crystal orientation detection 201 and 202 and the marking region for information 203 in a same process. As a result of this, according to Embodiment 1, the process of forming the crystal orientation mark 110 is very simple and inexpensive.

Since according to Embodiment 1, the crystal orientation mark 110 is made up of an array of a plurality of dots, the crystal orientation mark 110 can be easily formed by laser marking.

Since, according to Embodiment 1, it is configured such that the pattern of the marking region for information 203 is a pattern to show information to determine the crystal plane orientation of the wafer 100, it is possible to display the crystal plane orientation on the wafer 100 in an inexpensive and simple manner.

Since, according to Embodiment 1, it is only necessary to form the crystal orientation mark 110 on the surface of the wafer 100, high precision alignment is possible and process is simple and inexpensive even when a small-diameter wafer having a diameter of not more than 20 mm is used.

Since the method of detecting crystal orientation and detection device of crystal orientation according to Embodiment 1 are configured to determine the in-plane crystal axis of the wafer 100 by reading the marking regions for crystal orientation detection 201 and 202 of two locations, and demonstrate predetermined information from the pattern of the marking region for information 203, the determination of the in-plane crystal axis and determination of predetermined information are very simple. Therefore, it is possible to inexpensively realize alignment and determine information.

It is noted that although in Embodiment 1, description has been made taking as an example a case in which the present invention is applied to a semiconductor wafer, the present invention can be applied to manufacturing apparatuses that manufactures devices from other types of process substrates (for example, insulating substrates such as a sapphire substrate, and conductive substrates such as an aluminum substrate), and process substrates of non-disc shape (for example, rectangular shape).

REFERENCE SIGNS LIST

100 Wafer
110 Crystal orientation mark
120 Integrated circuit forming region
210, 202 Marking region for crystal orientation detection
203 Marking region for information
400 Reading device of crystal orientation mark
410 Wafer stage
420 Area sensor
430 Optical system
440 Computing section
441 Information reading section
442 Position detection section
450 Driving mechanism
460 Driving control section
501 Ingot
502 Groove
503 Large-diameter wafer
504 Notch
505 Linear mark
506 Imaginary line

The invention claimed is:

1. A process substrate comprising:
   a marking including
   a marking region for crystal orientation detection for indicating an in-plane crystal axis of the process substrate; and
   a marking region for information for indicating predetermined information relating to the process substrate, wherein
   the marking region for crystal orientation detection has two location marks formed at two different locations, and each of the two different locations is positioned at an outer edge portion of the process substrate,
   an orientation of the in-plane crystal axis of the process substrate coincides with a direction of a straight-line connecting the two location marks, and
   the marking region for information is formed along the straight-line and between the two location marks.

2. The process substrate according to claim 1, wherein the marking is at least one single line or broken line.

3. The process substrate according to claim 1, wherein at least part of the marking is formed by arranging a plurality of dots in a straight line shape or a broken line shape.

4. The process substrate according to claim 1, wherein the predetermined information contains information indicating a crystal plane orientation of the process substrate.

5. The process substrate according to claim 1, wherein the process substrate is a wafer having a diameter of not more than 20 mm.

6. A method of detecting an in-plane crystal axis of a process substrate, the process substrate including a marking, the marking including a marking region for crystal orientation detection for indicating the in-plane crystal axis of the process substrate, and a marking region for information for indicating predetermined information relating to the process substrate, the marking region for crystal orientation detection having two location marks formed at two different locations, each of the two different locations being positioned at an outer edge portion of the process substrate, an orientation of the in-plane crystal axis of the process substrate coinciding with a direction of a straight-line connecting the two location marks, and the marking region for information being formed along the straight-line between the two location marks, the method comprising:
   detecting the two location marks; and
   determining a straight-line connecting the detected two location marks, to thereby detect the in-plane crystal axis.

7. A reading device for reading a marking of a process substrate, the process substrate including a marking including a marking region for crystal orientation detection for indicating an in-plane crystal axis of the process substrate, and a marking region for information for indicating predetermined information relating to the process substrate is formed, the marking region for crystal orientation detection having two location marks formed at two different locations, each of the two different locations being positioned at an outer edge portion of the process substrate, an orientation of the in-plane crystal axis of the process substrate coinciding with a direction of a straight-line connecting the two location marks, and the marking region for information being formed along the straight-line between the two location marks, the reading device comprising:
   a reading section to read the marking including the marking region for crystal orientation detection and the marking region for information from the process substrate;
   a position detection section to determine the in-plane crystal axis of the process substrate from positions of the two location marks at the two different locations in the marking region for crystal orientation detection in the marking read by the reading section; and
   an information determination section to determine the predetermined information relating to the process substrate from a pattern formed in the marking region for information in the marking read by the reading section.

8. A process substrate according to claim 1, wherein a pattern of the marking region for information indicates a crystal plane orientation of the process substrate.

9. A process substrate according to claim 1, wherein a pattern of the marking region for information indicates a conduction type of n-type or p-type of the process substrate.

10. A process substrate according to claim 1, wherein a pattern of the marking region for information indicates a crystal plane orientation of the process substrate and a conduction type of n-type or p-type of the process substrate.

* * * * *

UNITED STATES PATENT AND TRADEMARK OFFICE
CERTIFICATE OF CORRECTION

PATENT NO. : 10,186,489 B2
APPLICATION NO. : 14/913176
DATED : January 22, 2019
INVENTOR(S) : Shiro Hara et al.

Page 1 of 1

It is certified that error appears in the above-identified patent and that said Letters Patent is hereby corrected as shown below:

In the Claims

In Column 10, Lines 25-26:
After "process substrate" delete "is formed".

Signed and Sealed this
Sixteenth Day of April, 2019

Andrei Iancu
*Director of the United States Patent and Trademark Office*